(12) United States Patent
Yeom

(10) Patent No.: US 9,170,441 B2
(45) Date of Patent: Oct. 27, 2015

(54) APPARATUS FOR FABRICATING FLAT PANEL DISPLAY, AND APPARATUS AND METHOD FOR DETECTING QUANTITY OF STATIC ELECTRICITY THEREOF

(75) Inventor: Young Min Yeom, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1814 days.

(21) Appl. No.: 11/433,560

(22) Filed: May 15, 2006

(65) Prior Publication Data
US 2007/0146621 A1   Jun. 28, 2007

(30) Foreign Application Priority Data
Dec. 28, 2005 (KR) .................. 10-2005-0132294

(51) Int. Cl.
| C23C 16/458 | (2006.01) |
| C23C 16/50 | (2006.01) |
| C23C 16/52 | (2006.01) |
| G02F 1/13 | (2006.01) |

(52) U.S. Cl.
CPC .......... *G02F 1/1309* (2013.01); *C23C 16/4583* (2013.01); *C23C 16/4585* (2013.01); *C23C 16/50* (2013.01); *C23C 16/52* (2013.01); *C23C 16/458* (2013.01); *C23C 16/4582* (2013.01)

(58) Field of Classification Search
CPC . G02F 1/1309; C23C 16/458; C23C 16/4582; C23C 16/4583; C23C 16/4585; C23C 16/50; C23C 16/52
USPC .......................................................... 118/715
See application file for complete search history.

(56) References Cited

U.S. PATENT DOCUMENTS

| 6,601,313 | B2 * | 8/2003 | Shin et al. ...................... 33/645 |
| 6,632,321 | B2 * | 10/2003 | Lill et al. .................. 156/345.24 |
| 2002/0083896 | A1 * | 7/2002 | Bae ................... 118/719 |
| 2007/0144673 | A1 * | 6/2007 | Yeom ...................... 156/345.54 |
| 2007/0146621 | A1 * | 6/2007 | Yeom ............................ 349/187 |

* cited by examiner

*Primary Examiner* — Jeffrie R Lund
(74) *Attorney, Agent, or Firm* — Morgan, Lewis & Bockius LLP

(57) ABSTRACT

A fabricating apparatus of a flat panel display device includes lift pins for lifting a substrate, a susceptor through which the lift pins pass, and a static electricity quantity detector for detecting a quantity of static electricity on the substrate by sensing when the susceptor separates from the substrate by sensing a traveled distance of the susceptor when the susceptor is separated from the substrate.

5 Claims, 7 Drawing Sheets

APPARATUS FOR FABRICATING FLAT PANEL DISPLAY, AND APPARATUS AND METHOD FOR DETECTING QUANTITY OF STATIC ELECTRICITY THEREOF

This application claims the benefit of the Korean Patent Application No. P2005-0132294 filed on Dec. 28, 2005, which is hereby incorporated by in its entirety.

BACKGROUND OF THE INVENTION

1. Field of the Invention

The present invention relates to a flat panel display device, and more particularly to an apparatus for fabricating apparatus of a flat panel display device, and apparatus and method for detecting a quantity of static electricity thereof.

2. Description of the Related Art

In today's information society, importance of a display device increases as information communication becomes more visual. A cathode ray tube (CRT) or Braun tube was the typical display up until recently. The CRT is heavy and big. In contrast, flat panel display devices are relatively light and have a thin profile. Such flat panel display devices include liquid crystal display (LCD), field emission display (FED) and organic light emitting diode (OLED) devices. These flat panel display devices are now on the market and practical to use.

Among these flat panel devices, the liquid crystal display device has low power consumption, high response speed and the capacity to be manufactured with a very large screen size. The liquid crystal display can be mass produced with a large size display or with a small size display. Thus, the liquid crystal display has been replacing the CRT in many applications.

Generally, a liquid crystal display device controls the light transmittance of liquid crystal cells that are arranged in a matrix shape on a liquid crystal display panel by adjusting a video data signal supplied thereto, thereby displaying a picture on the panel corresponding to the data signal. Further, the liquid crystal display device includes a lower substrate on which electrodes are formed, a thin film transistor on the lower substrate for switching the data signal for each of the electrodes of the liquid crystal cells, a data line on the lower substrate for supplying the data signal supplied from the outside to the liquid crystal cells and a control line on the lower substrate for supplying a control signal to the thin film transistor; an upper substrate on which a color filter is formed; a spacer between the upper and lower substrates to maintain a fixed cell gap between the upper and lower substrates; and a layer of liquid crystal molecules between the upper and lower substrates.

In a fabricating method of a the liquid crystal display device, an active layer having a channel part of the thin film transistor and a passivation film for protecting the thin film transistor are typically formed by use of PECVD (plasma enhanced chemical vapor deposition). FIG. 1 is a cross-sectional view of a fabricating apparatus used in a vacuum deposition process of the related art. The PECVD process forms the liquid crystal display device in the fabricating apparatus shown in FIG. 1.

The fabricating apparatus shown in FIG. 1 includes a process chamber 2 in which a deposition process is performed, and a susceptor 10 that applies heat to a substrate 4 within the process chamber 2 and is used as a lower electrode for generating plasma. Lift pins 6 are installed in the susceptor 10 for lifting the substrate 4. The substrate 4 is transferred onto the susceptor 10 by a robotic arm (not shown) and removed by the robotic arm after the deposition process. The susceptor 10 is fixed to a supporting stand 20. More specifically, the susceptor 10 is positioned within the process chamber 2 at a designated height by the supporting stand 20. The susceptor 10 can be repositioned in a vertical direction within the process chamber 2 by a timing belt (not shown) connected to the supporting stand 20.

The timing belt is driven by a motor (not shown) to move the supporting stand 20 a desired distance or mark, thereby making the susceptor 10 move to a position within the process chamber 2 corresponding to a distance or mark that the supporting stand 20 is at. Accordingly, the fabricating apparatus with such a configuration makes the susceptor 10 on which the substrate 4 is loaded rises to a position where the deposition process can be performed, and applies heat and voltage to the substrate 4 such that a thin film can be deposited with a gas and plasma.

FIG. 2A is a cross-sectional view of a bent substrate because of static electricity generated after a vacuum deposition process. In a plasma deposition process, a large static charge can be created between the substrate 4 and the susceptor 10 by an RF (radio frequency) discharge used to create plasma. The charge (static electricity) causes the substrate 4 to stick or to be attracted to the susceptor 10. Accordingly, as shown in FIG. 2A, a problem is created in the middle part of the substrate 44 where no lift pins are located when the lift pins 46 are deployed by the lowering of the susceptor 10 so that the robot arm (not shown) can pick up the substrate 44. The static electricity retains the center portion of the substrate 44 against the susceptor 50 while the lift pins 46 deploy up as the susceptor 10 lowers so that the substrate 44 is bent. Because the substrate 44 is bent, the robot arm may not be able to get under the bent substrate 44 and may break the bent substrate 44 in trying to do so. Even if the robot arm gets under the bent substrate 44, the substrate 44 will have residual static electric charge.

To prevent such problems, a separate static charge control process is typically performed after completing the deposition process. Specifically, the static charge control process includes injecting an inert gas, such as He, Ne or $N_2$ gas, through a gas injection hole of the chamber, and then changing the injected inert gas into a plasma state by applying an RF power of about 400 W. The inert gas plasma neutralizes the static electric charge in the middle part of the substrate 44. The application time of the RF power is longer for larger amounts of more static electricity.

FIG. 2B is a cross-sectional view of a quantity of static electricity detected by the naked eye in the related art. To efficiently remove the static electricity generated between the upper part of the susceptor 50 and the substrate 44, the application time of the RF power to create the inert gas plasma should be adjusted in correspondence to the quantity of static electricity on the substrate. Various factors, such as environmental change within the chamber, can change the amount of static electricity generated. To this end, correct detection of the quantity of static electricity should be done so that an appropriate application time of the RF power to create the inert gas plasma can be determined. As shown in FIG. 2B, the effect of the static electricity is monitored by a naked eye 80 of a user through an external window 70 of the chamber 42 in the related art. That is to say, after completion of the deposition process, the application time of the RF power to create the inert gas plasma is controlled by a user who turned off the RF power, lower the susceptor 50 to deploy the lift pins 46 to see if the substrate 44 is no longer bent. If the substrate 44 is still bent, the susceptor 50 would be raised to undeploy the lift pins 46 and the substrate 44 would be resubjected to the inert gas plasma.

The related art apparatus and method for detecting the static electricity depends on user's judgment. Further, there may be still lingering static electricity that can cause problems when the substrate is moved after being determined as unbent. For example, a lingering static electricity can create significant attractive forces between the substrate and the robotic arm that can cause a damaging flex of the substrate during a subsequent release of the substrate by the robotic arm. In the related art, it is not possible to judge the generated quantity of static electricity, much less the residual amount of static electricity on the substrate. Thus, there is still a possibility that the substrate can be damaged by a residual static electric charge.

SUMMARY OF THE INVENTION

Accordingly, the present invention is directed to an apparatus for fabricating apparatus of a flat panel display device, and apparatus and method for detecting a quantity of static electricity thereof that substantially obviate one or more of the problems due to limitations and disadvantages of the related art.

Accordingly, it is an object of the present invention is to provide an apparatus and method for detecting the quantity of static electricity quantity.

Another object of the present invention is to provide a fabricating apparatus of a flat panel display device for preventing a substrate from being damaged by a residual static electricity, and an apparatus and method to prevent damaging residual static electricity.

To achieve these and other objects of the invention, a fabricating apparatus of a flat panel display device includes lift pins for lifting a substrate, a susceptor through which the lift pins pass, and a static electricity quantity detector for detecting a quantity of static electricity on the substrate by sensing when the susceptor separates from the substrate by sensing a traveled distance of the susceptor when the susceptor separates from the substrate.

In another aspect, an apparatus for detecting a quantity of static electricity quantity on a susceptor in deposition equipment includes a light emitter for transmitting light through a space between the susceptor and a substrate during descent of the susceptor, a light receiver for receiving the transmitted light, a traveled-distance sensing part for sensing a traveled distance, and a controller for detecting a static electricity quantity on the substrate by use of a sensed traveled-distance value and a detected light amount from the light receiver.

In another aspect, a method for detecting a static electricity quantity on a susceptor in deposition equipment having a plurality of lift pins for lifting the substrate and a susceptor through which the lift pin passes includes a transmitting light to a space formed between the susceptor and the substrate upon movement of the susceptor, and simultaneously sensing a traveled distance of the susceptor, and detecting a static electricity quantity on the substrate by use of the sensed traveled-distance value and the transmitted light amount.

In another aspect, a fabricating apparatus of a flat panel display device includes lift pins for lifting a substrate, the lift pins being able to ascend and descend, a susceptor through which the lift pins pass, and a static electricity quantity detector for detecting a static electricity quantity on the substrate by sensing when the susceptor is separated from the substrate due to an ascent of the lift pin and by sensing a traveled distance of the lift pins when the susceptor is separates from the substrate.

In yet another aspect, a method for detecting a static electricity quantity on a susceptor in deposition equipment having a plurality of lift pins for lifting a substrate and the susceptor through which the lift pins pass includes transmitting light to a space formed between the susceptor and the substrate upon movement of the lift pins, and simultaneously sensing a traveled distance of the lift pins, and detecting a static electricity quantity on the substrate by use of a sensed traveled-distance value and the transmitted light amount.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
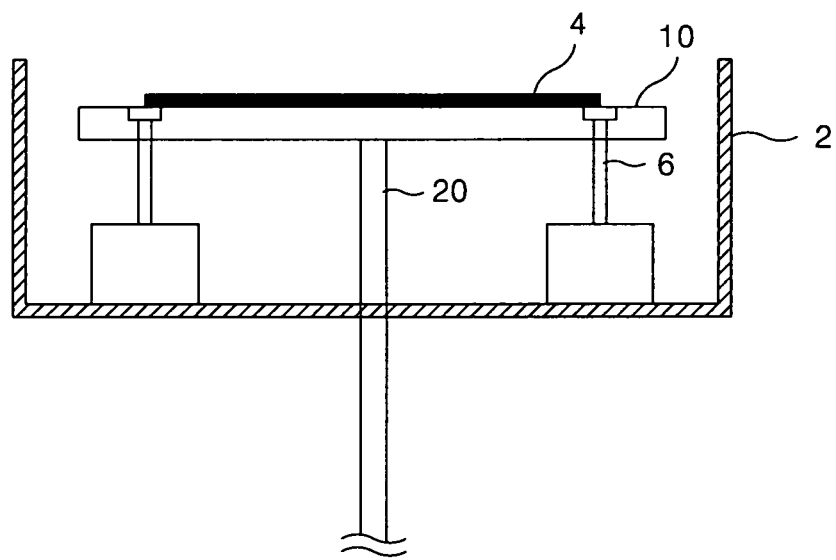
FIG. 1 is a cross-sectional view of a fabricating apparatus used in a vacuum deposition process of the related art.
Figure 2A:
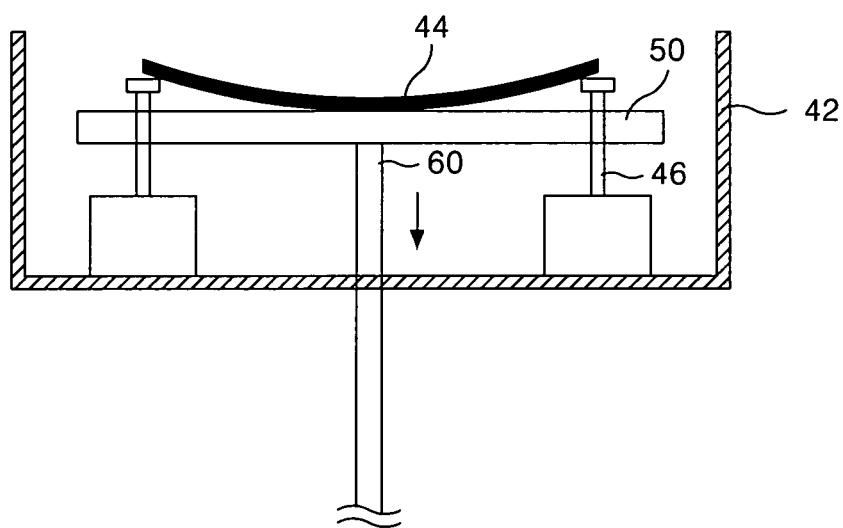
FIG. 2A is a cross-sectional view of a bent substrate because of static electricity generated after a vacuum deposition process.
Figure 2B:
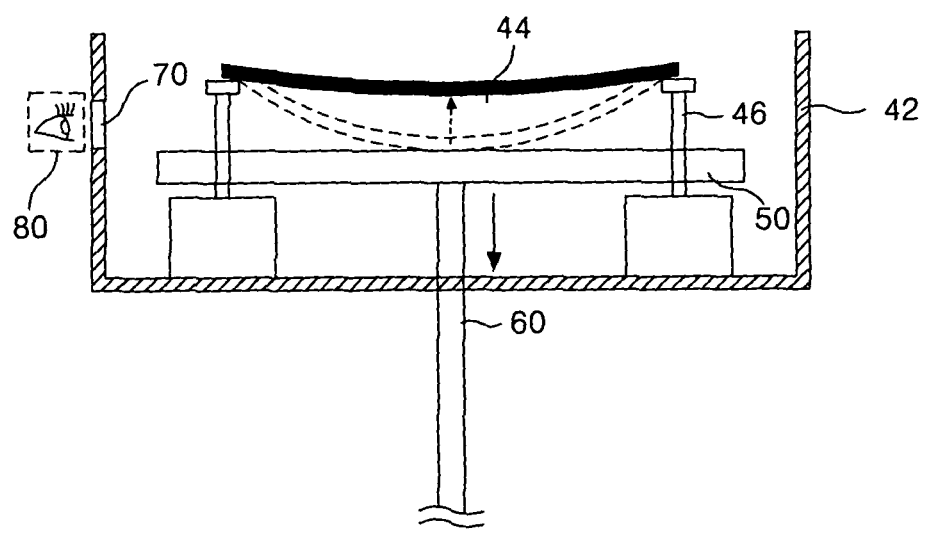
FIG. 2B is a cross-sectional view of a quantity of static electricity detected by the naked eye in the related art.
Figure 3:
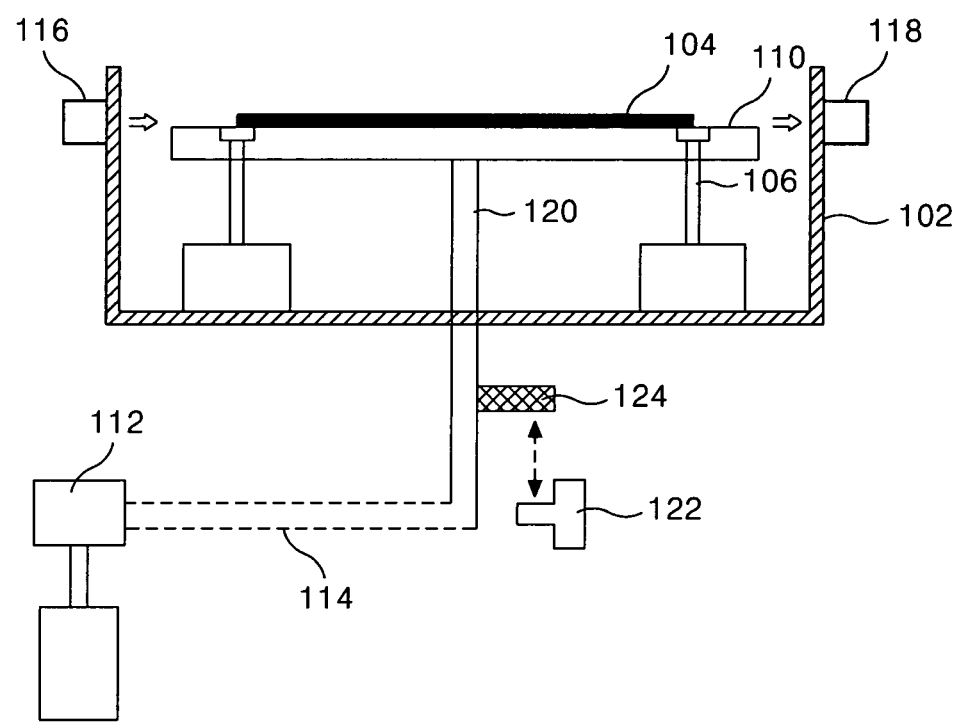
FIG. 3 is a cross-sectional view of a fabricating apparatus of a flat panel display device used in a vacuum deposition process according to a first embodiment of the present invention.

FIG. 3 is a cross-sectional view of a fabricating apparatus of a flat panel display device used in a vacuum deposition process according to a first embodiment of the present invention. As shown in FIG. 3, the fabricating apparatus of the flat panel display device according to the first embodiment of the present invention includes a process chamber 102 in which a deposition process is performed; a susceptor 110 able to ascend and descend; lift pins 106 in the susceptor for lifting the substrate 104 within the process chamber 102; a static electricity quantity detector for detecting a quantity of static electricity on the substrate 104 by sensing when the susceptor 110 separates from the substrate 104 as the susceptor 110 is descending so as to deploy the lift pins 106 and by sensing a distance traveled by the susceptor 110 when the susceptor 110 separates from the substrate 104. The static electricity quantity detector includes a light emitter 116 for generating light through a space between the substrate 104 and the susceptor 110 for sensing when the susceptor 110 separates from the substrate 104 during the descent of the susceptor 110 that deploys the lift pins 106; a light receiving sensor 118 for receiving the generated light; and a distance-traveled sensor 122 for sensing the distance traveled of the susceptor 110 during the descent.

A process of detecting the quantity of static electricity on the substrate using the fabricating apparatus of the flat panel display device according to the first embodiment of the present invention is as follows. After a deposition process is complete, the susceptor 110 is lowered so that the lift pins are 106 are deployed to raise the substrate 104 off of the susceptor 104. The susceptor 110 is affixed to a supporting stand 120. The susceptor 110 is moved in a vertical direction by a timing belt 114, which is connected to the supporting stand 120, and a motor 112, which drives the time belt 114.

A static electric charge generated between the substrate 104 and the susceptor 110 by an RF discharge during the deposition process prevents the substrate 104 from properly separating from the susceptor 110 due to static electricity holding the middle part of the substrate where no lift pins are located when the lift pins are deployed and thus the substrate 104 is bent as a result. To remove the static electric charge, a static electricity controlling treatment is performed to neutralize the static electric charge. However, a correct detection of the quantity of the static electricity quantity is made before a static electricity controlling treatment is performed. The correct detection of the quantity of the static electricity enables the proper application time of the static electricity controlling treatment to remove enough static electric charge to prevent any damage to the substrate 104. After the static electricity controlling treatment, a robotic arm (not shown) can then get under the substrate 104 after the susceptor 110 descends and takes the substrate 104 to a subsequent processing station by a robotic arm (not shown).

To correctly detect a quantity of static electricity, the light emitter 116 installed in the vicinity of one side of the susceptor 110 generates light toward the substrate 104 and the susceptor 110, which is affixed to the supporting stand 120. Then, the susceptor 110 descends along with the supporting stand 120 by the operation of the time belt 114 driven by the motor 112 to deploy the lift pins 106 through the susceptor 110. When the substrate 104 and the susceptor 110 are separate from each other, the generated light is received by the light receiver 118 installed in the vicinity of the other side of the susceptor 110. Until the light amount received by the light receiver 118 becomes not less than a pre-set reference light amount, the light emitter 116 emits light under control of a controller (not shown).

To correctly detect a quantity of static electricity, the traveled-distance sensor 122 for sensing a traveled distance of the susceptor 110 during the descent of the susceptor starts to operate at the moment the susceptor 110, which is affixed to the supporting stand 120, descends along with the supporting stand 120 by the operation of the timing belt 114 driven by the motor 112. The traveled-distance sensor 122 includes light emitting and sensing parts integrated into one module, and receives reflected light through the light sensing part if the light generated from the light emitting part is reflected from a sensor part 124 installed at one side of the supporting stand 120. The traveled-distance sensor 122 senses the traveled distance (i.e., descent distance) of the susceptor on the basis of the sensed light and outputs an electronic signal corresponding to the determined amount of traveled distance.

The traveled-distance sensor 122 senses the amount of the traveled distance of the susceptor continuously from the start of the descent for the susceptor 110 to the point when the substrate is completely separated from the susceptor under control of the controller (not shown). The controller detects a quantity of static electricity quantity on the substrate 110 using the amount of the traveled distance of the susceptor 110 when the amount of the light received by the light receiver becomes greater than the pre-set reference light amount.

Figure 4:
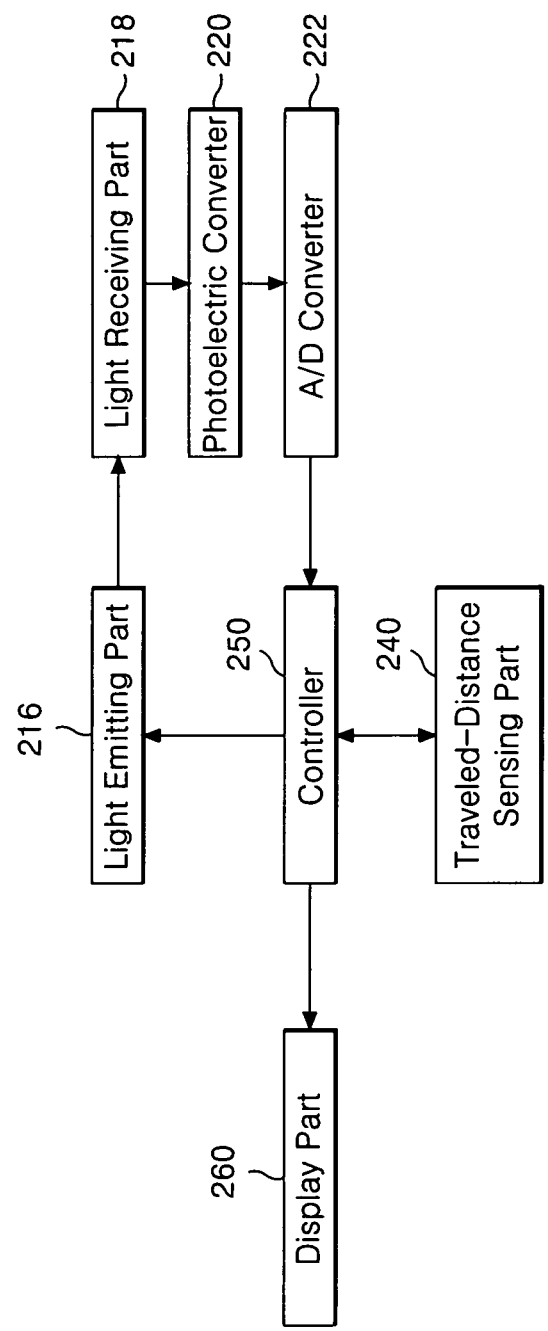
FIG. 4 is a block configuration diagram of an apparatus for detecting a quantity of static electricity according to the first embodiment of the present invention.

FIG. 4 is a block configuration diagram of a static electricity detection apparatus according to the first embodiment of the present invention. Referring to FIG. 4, the apparatus for detecting a quantity of static electricity according to the first embodiment of the present invention includes a light emitter 216 for transmitting light through the space between the susceptor and the substrate when the substrate separates from the susceptor; a light receiver 218 for receiving the transmitted light; a traveled-distance sensing part 240 for sensing the traveled distance of the susceptor; a controller 250 for detecting a static electricity quantity on the substrate by using the sense traveled-distance amount when the light amount detected by the light receiver 218 is greater than a pre-set reference light amount; and a display part 260 for displaying the detected quantity of static electricity.

To detect the quantity of static electricity quantity generated between the substrate and the susceptor by the RF discharge during the deposition process, the controller 250 applies a control signal to the light emitting part 216 at the same time as the susceptor 110 descends so as to let the light emitter 216 transmit light through the space between the substrate 104 and the susceptor 110 when the substrate 104 and the susceptor 110 separate. Further, the controller 250 applies a control signal to the traveled-distance sensing part 240 at the same time as the descent of the susceptor 110 to sense the amount of traveled distance (descending distance) for the susceptor in real time.

The light emitted from the light emitter part 216 is transmitted through the space formed between the substrate and the susceptor to the light receiving part 218 when the substrate 104 and the susceptor 110 separate from each other. The light received in the light receiver 218 is converted into the electric signal through a photoelectric converter 220 to be inputted to as analog signal into an A/D converter 222. The analog signal input through the AID converter 222 is converted into a digital signal for input to the controller 250.

During the descent of the susceptor 110, the middle part of the substrate 104 where no lift pins are not located, sticks to the susceptor 110 because of the static electricity until a point in which the lift pins separate the substrate 104 from the susceptor 110. Until the substrate 104 and the susceptor are separated from each other, the transmitted light is reflected or interfered by the substrate to make the amount of the received light by the light receiving part 218 less than a reference amount. Accordingly, the controller 250 compares the pre-set designated reference amount with a digital signal value inputted by the A/D converter to determine the point when the substrate 104 is completely separated from the susceptor 110. As a result of the comparison, if the digital signal value is greater than the reference amount, the controller 250 determines that the substrate is completely separated from the susceptor.

When substrate 104 separates from the susceptor 110, the controller 250 stores the sensed travel-distance value from among the sensed traveled-distance values of the susceptor input in real time from the traveled-distance sensing part 240 when the distal signal value is greater than the reference amount. The stored sensed travel-distance value is used to determine the quantity of static electricity from a lookup table in a memory part (not shown) of quantity of static electricity corresponding to the traveled-distance value of the susceptor, and the determined quantity of static electricity is set forth as the detected quantity of static electricity on the substrate. The detected static electricity quantity can be shown to the user through the display part 260, and the user adjusts the application time of RF power (generally 400 W) on this basis to remove static electricity from the substrate that can cause damage to the substrate.

Figure 5:
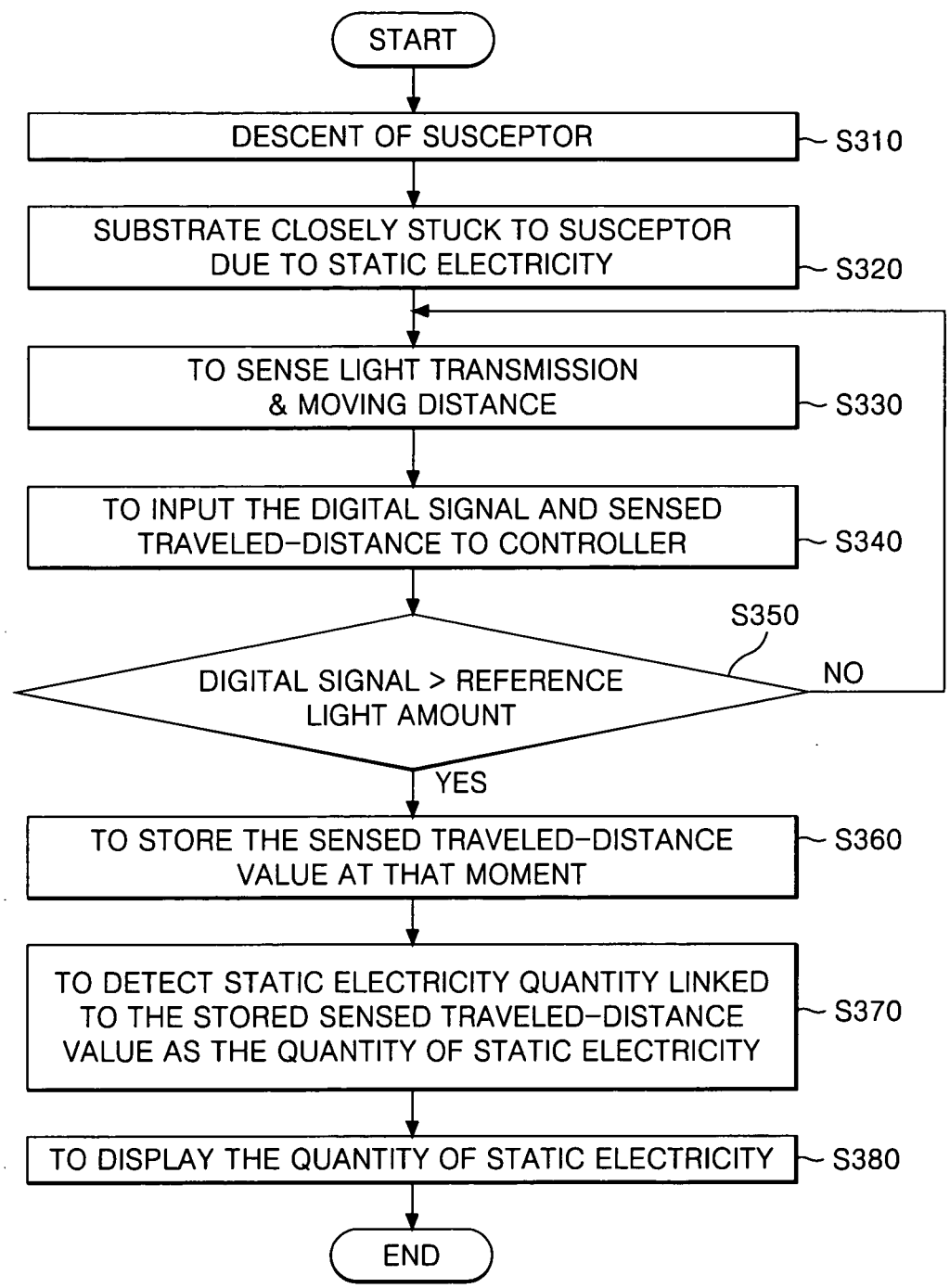
FIG. 5 is a flow chart of a method for detecting a quantity of static electricity according to the first embodiment of the present invention.

FIG. 5 is a flow chart of a method for detecting a quantity of static electricity according to the first embodiment of the present invention. First, as outlined by step 310 in FIG. 5, the susceptor descends and deploys lift pins to provide an entry space for the robotic arm so that the substrate of which the deposition process is completed can be transferred to a subsequent process. However, static electricity generated between the substrate and the susceptor by the RF discharge of the deposition process prevents the substrate from easily separating in the middle part of the substrate where no lift pin is located upon the descent of the susceptor, as outlined in step S320 of FIG. 5. To detect the quantity of static electricity, a light emitter transmits light at the substrate and the susceptor at the same time as the susceptor descends. Further, the traveled-distance sensing part senses the traveled distance (descended distance) of the susceptor in real time at the same time as the descent of the susceptor by the control signal of the controller, as outlined by step S330 of FIG. 5.

The light emitted from the light emitter part is transmitted through a space between the substrate and the susceptor to the light receiver part when the substrate and the susceptor separate from each other. The light received at the light receiver is converted into an electric signal through the photoelectric converter and goes through the A/D converter, thereby being converted into a digital signal value to be input to the controller. At this moment, the distance-traveled value for the distance traveled by the susceptor sensed by the distance-traveled sensing part is also input to the controller in real time, as outlined by step S340 of FIG. 5.

The controller compares the reference light amount with the digital signal value from the A/D converter in to determine when the substrate is completely separated from the susceptor. If the digital signal value is less than the reference light amount, the controller determines that the substrate is not completely separated from the susceptor, thus the controller continuously receives the digital signal value and the sensed traveled-distance value until the digital signal value reaches the reference light amount value, as shown in step S350 of FIG. 5. If the digital signal value is not less than the reference light amount, the controller determines that the substrate is completely separated from the susceptor and stores the sensed traveled-distance value of the susceptor, as outlined by step S360 of FIG. 6.

The stored sensed traveled-distance value is used to determine the detected quantity of static electricity from a lookup table in the memory (not shown) that provides a detected quantity of static electricity corresponding to the stored sensed traveled-distance value of the susceptor, as outlined by step S370 of FIG. 5. The detected quantity of static electricity is shown to the user on the display part, as outlined by step S380 of FIG. 5.

Figure 6:
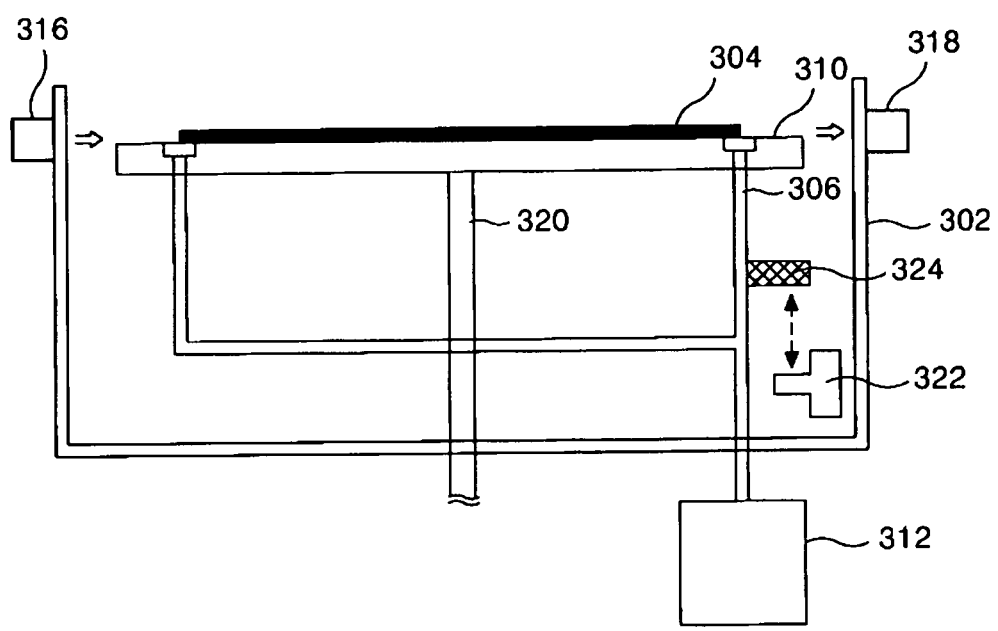
FIG. 6 is a cross-sectional view of a fabricating apparatus of a flat panel display device used in a vacuum deposition process according to a second embodiment of the present invention.

FIG. 6 is a cross-sectional view of a fabricating apparatus of a flat panel display device according to a second embodiment of the present invention. Referring to FIG. 6, the fabricating apparatus of the flat panel display device according to the second embodiment of the present invention includes a process chamber 302 where a deposition process is performed; lift pins 306 for lifting the substrate 304; a susceptor 310 within the process chamber 302; a static electricity quantity detector for detecting a quantity of static electricity quantity on the substrate 304 by sensing when the susceptor 310 is separated from the substrate 304 during the ascent of the lift pins 306 after the susceptor 310 is stuck to the substrate 304 by static electricity and by sensing a traveled distance of the lift pins 306 at the moment when the susceptor 310 is separated from the substrate 304.

The static electricity quantity detector includes a light emitter 316 for generating a light through a space between the substrate 304 and the susceptor 310 when the susceptor 310 is separated from the substrate 304 during ascent of the lift pins 306; a light receiver 318 for receiving the generated light; and a traveled-distance sensor 322 for sensing the traveled distance of the susceptor 310 upon the ascent of the lift pins 306.

A process of detecting the static electricity quantity on substrate by use of the fabricating apparatus of the flat panel display device according to the second embodiment of the present invention having such a configuration is as follows. The lift pins 306 ascend upward by a motor 312 after the deposition process is completed so that the substrate 304 can be positioned for a subsequent process by a robot arm (not shown).

The susceptor 310 is affixed to a supporting stand 320 while the lift pins 306 ascend to lift the substrate 304 such that there is a space between the susceptor 310 and the substrate 304 into which the robot arm can enter. A static electric charge placed on the substrate 304 by the RF discharge during the deposition process such that the substrate 304 can not be easily separated from the susceptor 310 in the middle part of the substrate 304 where no lift pins 306 are located when the lift pin ascends. Thus, the substrate 304 is bent as a result. To remove the static electricity, a static electricity controlling treatment is performed to neutralize the static electric charge. However, a correct detection of quantity of the static electricity should be made before the static electricity controlling treatment to determine the application time of the static electricity controlling treatment such that static electricity on the substrate, which can cause damage, can be prevented.

To correctly detect a quantity of static electricity, a light emitter 316 is installed in the vicinity of one side of the susceptor 310 to generates light toward the substrate 304 and the susceptor 310 the moment the lift pins 306 starts to ascend by the motor 312. The generated light is received by a light receiver 318 installed in the vicinity of the other side of the susceptor 310 when the substrate 304 is separated from the susceptor 310. Until the light amount value received by the light receiver 318 becomes greater than a pre-set reference light amount, the light emitter 316 emits light under control of a controller (not shown).

To detect a correct static electricity quantity, the traveled-distance sensor 322 for sensing an ascending distance of the lift pin 306 starts to operate the moment the lift pin 306 ascends by the motor 312. Herein, the traveled-distance sensor 322 includes the light emitting and receiving parts which are integrated into one module, and receives a reflected light from the from a sensor part 324 installed in one side of the lift 306. The traveled-distance sensor 322 senses the amount of the traveled distance of the lift pins continuously from the start of the ascent of the lift pins 306 to when the substrate is completely separated from the susceptor) under control of the controller (not shown). The traveled-distance sensor 322 senses the traveled distance of the lift pin 306 continuously from the first ascending moment of the lift pin 306 to when the substrate is completely separated from the susceptor under control of the controller (not shown). The controller (not shown) detects the static electricity quantity on the substrate 304 using the amount of the traveled distance of the susceptor 110 when the amount of the light received by the light receiver becomes greater than the reference light amount.

A specific method for determining the detecting quantity of static electricity is the same as the first embodiment, thus it will be omitted hereinafter. The fabricating apparatus of the flat panel display device according to the second embodiment of the present invention includes a display part for displaying the detected quantity of static electricity.

As described above, the fabricating apparatus of the flat panel display device, and the apparatus and method for detecting the quantity of static electricity thereon according to embodiments of the present invention determines when the substrate is separated from the susceptor by use of a separate optical receiver and detects the quantity of static electricity corresponding to the traveled distance (or the ascending distance) of the lift pin) of the susceptor when the substrate separates from the susceptor, thereby correctly detecting the quantity of static electricity easily and effectively. Further, the fabricating apparatus of the flat panel display device, and the apparatus and method for detecting quantity of the static electricity thereon according to embodiments of the present invention correctly detects the quantity of static electricity on the substrate, thereby making it possible to prevent the damage of the substrate caused by residual static electricity.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A fabricating apparatus of a flat panel display device, comprising:
   lift pins for lifting a substrate;
   a susceptor through which the lift pins pass;
   a light emitter for transmitting light to a space between the susceptor and the substrate during descent of the susceptor;
   a light receiver for receiving the transmitted light;
   a traveled-distance sensing part for sensing the traveled distance of the susceptor;
   a controller for automatically determining whether the substrate is separated from the susceptor by use of a sensed traveled-distance value from the traveled-distance sensing part and a detected light amount from the light receiver, storing the sensed traveled-distance value when a detected light amount is greater than a pre-set reference light amount value, and determining a quantity of static electricity charge by linking one pre-set static electricity charge value corresponding to the stored sensed traveled-distance in a lookup table in a memory; and
   a display part for displaying the quantity of static electricity charge determined by the controller, for determining an application time of a radio frequency (RF) power to counter the static electricity charge.

2. The fabricating apparatus according to claim 1, wherein the lift pins are deployed to lift a substrate as the susceptor descends.

3. An apparatus fabricating a flat panel display device, comprising:
   a light emitter for transmitting light through a space between the susceptor and a substrate during descent of the susceptor;
   a light receiver for receiving the transmitted light;
   a traveled-distance sensing part for sensing a traveled distance of the susceptor;
   a controller for automatically determining whether the substrate is separated from the susceptor by use of a sensed traveled-distance value and a detected light amount from the light receiver, storing the sensed traveled-distance value when a detected light amount is greater than a pre-set reference light amount value, and determining a quantity of static electricity charge by linking one pre-set static electricity charge value corresponding to the stored sensed traveled-distance in a lookup table in a memory; and
   a display part for displaying the quantity of static electricity charge detected by the controller, for determining an application time of a radio frequency (RF) power to counter the static electricity charge.

4. The apparatus according to claim 3, wherein the traveled distance is the traveled distance of the susceptor.

5. A fabricating apparatus of a flat panel display device, comprising:
   lift pins for lifting a substrate, the lift pins being able to ascend and descend;
   a susceptor through which the lift pins pass;
   a light emitter for transmitting light to a space between the susceptor and the substrate during ascent of the lift pins;
   a light receiver for receiving the transmitted light;
   a traveled-distance sensing part for sensing the traveled distance of the lift pins;
   a controller for automatically determining whether the substrate is separated from the susceptor by use of a sensed traveled-distance value and a detected light amount from the light receiver part, storing the sensed traveled-distance value when a detected light amount is greater than a pre-set reference light amount value, and determining a quantity of static electricity charge by linking one pre-set static electricity charge value corresponding to the stored sensed traveled-distance in a lookup table in a memory; and
   a display part for displaying the quantity of the static electricity determined by the controller, for determining an application time of a radio frequency (RF) power to counter the static electricity charge.

* * * * *